United States Patent
Yu et al.

(10) Patent No.: US 11,145,753 B2
(45) Date of Patent: Oct. 12, 2021

(54) BALLISTIC TRANSPORT SEMICONDUCTOR DEVICE BASED ON NANO ARRAY AND MANUFACTURING METHOD

(71) Applicant: SUZHOU INSTITUTE OF NANO-TECH AND NANO-BIONICS (SINANO), CHINESE ACADEMY OF SCIENCES, Suzhou (CN)

(72) Inventors: Guohao Yu, Suzhou (CN); Fu Chen, Suzhou (CN); Wenxin Tang, Suzhou (CN); Xiaodong Zhang, Suzhou (CN); Yong Cai, Suzhou (CN); Baoshun Zhang, Suzhou (CN)

(73) Assignee: SUZHOU INSTITUTE OF NANO-TECH AND NANO-BIONICS (SINANO), CHINESE ACADEMY OF SCIENCES, Jiangsu (CN)

( * ) Notice: Subject to any disclaimer, the term of this patent is extended or adjusted under 35 U.S.C. 154(b) by 37 days.

(21) Appl. No.: 16/631,167

(22) PCT Filed: May 8, 2019

(86) PCT No.: PCT/CN2019/085976
§ 371 (c)(1),
(2) Date: Jan. 15, 2020

(87) PCT Pub. No.: WO2019/218908
PCT Pub. Date: Nov. 21, 2019

(65) Prior Publication Data
US 2020/0227541 A1    Jul. 16, 2020

(30) Foreign Application Priority Data

May 17, 2018   (CN) .......................... 201810476802.8
Jun. 27, 2018   (CN) .......................... 201810682762.2

(51) Int. Cl.
*H01L 29/76* (2006.01)
*H01L 29/06* (2006.01)
(Continued)

(52) U.S. Cl.
CPC ...... *H01L 29/7606* (2013.01); *H01L 21/0217* (2013.01); *H01L 21/0254* (2013.01);
(Continued)

(58) Field of Classification Search
CPC ............. H01L 29/7606; H01L 29/0676; H01L 29/1608; H01L 29/20; H01L 29/2003;
(Continued)

(56) References Cited

U.S. PATENT DOCUMENTS

2010/0295023 A1* 11/2010 Franklin ............. H01L 29/0665
257/24
2014/0034120 A1*  2/2014 Wang ................. H01L 21/02521
136/255

* cited by examiner

*Primary Examiner* — Tong-Ho Kim
(74) *Attorney, Agent, or Firm* — PROI Intellectual Property US; Klaus Michael Schmid

(57) ABSTRACT

The present disclosure discloses a ballistic transport semiconductor device based on nano array and a manufacturing method thereof. The ballistic transport semiconductor device based on nano array comprises a conducting substrate, more than one semiconductor nano bump portion is arranged on a first surface of the conducting substrate, a top end of the semiconductor nano bump portion is electrically connected with a first electrode, a second surface of the conducting substrate is electrically connected with a second electrode, the second surface and the first surface are arranged back to back, and the height of the semiconductor nano bump portion is less than or equal to a mean free path of a carrier. The carrier is not influenced by various scattering mechanisms in a transporting procedure by virtue of the existence of ballistic transport characteristics, thereby (Continued)

obtaining a semiconductor device having advantages of lower on resistance, less working power consumption.

13 Claims, 7 Drawing Sheets

(51) Int. Cl.
 *H01L 29/16*  (2006.01)
 *H01L 29/20*  (2006.01)
 *H01L 29/22*  (2006.01)
 *H01L 29/24*  (2006.01)
 *H01L 29/423*  (2006.01)
 *H01L 29/786*  (2006.01)
 *H01L 21/02*  (2006.01)
 *H01L 29/66*  (2006.01)
 *H01L 29/872*  (2006.01)

(52) U.S. Cl.
 CPC .. *H01L 21/02164* (2013.01); *H01L 21/02178* (2013.01); *H01L 21/02529* (2013.01); *H01L 21/02532* (2013.01); *H01L 21/02546* (2013.01); *H01L 21/02554* (2013.01); *H01L 21/02565* (2013.01); *H01L 21/02603* (2013.01); *H01L 29/0676* (2013.01); *H01L 29/1608* (2013.01); *H01L 29/20* (2013.01); *H01L 29/2003* (2013.01); *H01L 29/22* (2013.01); *H01L 29/24* (2013.01); *H01L 29/42392* (2013.01); *H01L 29/66143* (2013.01); *H01L 29/66742* (2013.01); *H01L 29/78642* (2013.01); *H01L 29/78696* (2013.01); *H01L 29/872* (2013.01)

(58) Field of Classification Search
 CPC ... H01L 29/22; H01L 29/24; H01L 29/42392; H01L 29/66143; H01L 29/66742; H01L 29/78642; H01L 29/78696; H01L 29/872; H01L 21/02164; H01L 21/0217; H01L 21/02178; H01L 21/02529; H01L 21/02532; H01L 21/0254; H01L 21/02565; H01L 21/02603
 USPC .......................................................... 257/29
 See application file for complete search history.

BALLISTIC TRANSPORT SEMICONDUCTOR DEVICE BASED ON NANO ARRAY AND MANUFACTURING METHOD

TECHNICAL FIELD

The present disclosure relates to semiconductor devices, in particular, to a ballistic transport semiconductor device based on nano array and manufacturing method thereof, and belongs to the field of electronic science and technology.

BACKGROUND

Currently, a semiconductor electronic device is widely applied to various fields. A typical semiconductor electronic device comprises a high-electron-mobility transistor (HEMT, which is also called a heterojunction field-effect transistor (HFET)), and a Schottky diode (which is also called a Schottky barrier diode (SBD)).

The existing Schottky diode and the HEMT mainly have two structures, namely a planar structure (a lateral structure) and a vertical structure. However, no matter which structure the existing Schottky diode and the HEMT have, unavoidable scattering mechanisms, including semiconductor material ionized impurity scattering, optical wave scattering and acoustic wave scattering generated by lattice vibrations, intervalley scattering, dislocation scattering and the like, cause speed reduction and loss increase of carriers in a transporting procedure. Therefore, conducting loss and switching loss generated by a device in an operating procedure are largely increased such that the device generates a large amount heat. Such additional heat generation increases energy loss again, and the development tendency of miniaturization and thinness is not met. Furthermore, loss heat generated in the carrier transporting procedure also greatly influences the reliability and the service life of the device.

SUMMARY

A main objective of the present disclosure is to provide a ballistic transport semiconductor device based on nano array and manufacturing method thereof in order to overcome deficiencies in the prior art.

To achieve the above objective, technical solutions adopted by the present disclosure comprise:

an embodiment of the present disclosure provides a ballistic transport semiconductor device based on nano array, which comprises more than one semiconductor nano bump portions, a source, a drain and a gate; each semiconductor nano bump portion comprises a conducting channel, the source, the gate and the drain are sequentially arranged in a length direction of the semiconductor nano bump portion at intervals, the source and the drain are electrically connected through the conducting channel, the gate is arranged around the semiconductor nano bump portion, the gate and the semiconductor nano bump portion match with each other to form a Schottky heterojunction, and an effective length of the conducting channel is less than a mean free path of a carrier.

An embodiment of the present disclosure further provides a manufacturing method of a ballistic transport semiconductor device based on nano array, which comprises:

Manufacturing or conducting epitaxy on at least one semiconductor nano bump portion, wherein the semiconductor nano bump portion comprises a conducting channel, and an effective length of the conducting channel is less than a mean free path of a carrier; and sequentially manufacturing a source, a gate and a drain in a length direction of the semiconductor nano bump portion, wherein the source and the drain are electrically connected through the conducting channel, the gate is arranged around the semiconductor nano bump portion, and the gate and the semiconductor nano bump portion match with each other to form a Schottky heterojunction.

Compared with the prior art, the present disclosure has the following advantages:

(1), to a ballistic transport vertical transistor based on a nano array and a ballistic transport Schottky diode based on a nano array provided by the present disclosure, the height, namely an effective channel length L of the device, of a vertical-structure semiconductor nano bump portion (also called a nanopillar) is less than a mean free path $\lambda$, so carriers in the device are transported in a ballistic transport manner;

(2), by virtue of the ballistic transport, the carriers in the device are not influenced by various scattering mechanisms in a transporting procedure so that the semiconductor device has a lower on resistance;

(3), by virtue of the ballistic transport, the carriers in the device are not influenced by the various scattering mechanisms in the transporting procedure so that loss caused by the carriers in the transporting procedure is largely reduced, working loss is reduced, and the cooling system can be simplified;

(4), by virtue of the ballistic transport, the carriers in the device are not influenced by the various scattering mechanisms in the transporting procedure so that the saturated drift velocity of the carriers are increased and the working frequency of the device is improved;

(5), the height of the vertical-structure semiconductor nanopillar is less than the mean free path $\lambda$ so that the size of the device is reduced, and then the device is more convenient in an integrating procedure; and (6), utilization of a nanopillar bump portion array facilitates reduction of the internal defect density of a material to reduce defect-caused electron capture effect.

DESCRIPTION OF THE EMBODIMENTS

In view of deficiencies of the prior art, the inventors of the present disclosure provide the technical solution of the present disclosure based on long-term research and a lot of practices. The following further explains and describes the technical solution, implementation processes and principles of the present disclosure.

An embodiment of the present disclosure provides a ballistic transport semiconductor device based on nano array, which comprises a conducting substrate, more than one semiconductor nano bump portion is arranged on a first surface of the conducting substrate, a top end of the semiconductor nano bump portion is electrically connected with a first electrode, a second surface of the conducting substrate is electrically connected with a second electrode, the second surface and the first surface are arranged back to back, and the height of the semiconductor nano bump portion is less than or equal to a mean free path of a carrier.

Further, the ballistic transport semiconductor device based on nano array comprises a nano bump portion array formed by a plurality of semiconductor nano bump portions which are distributed at intervals.

In some embodiments, the semiconductor device is a Schottky diode, its first electrode is an anode, and its second electrode is a cathode.

Figure 1A:
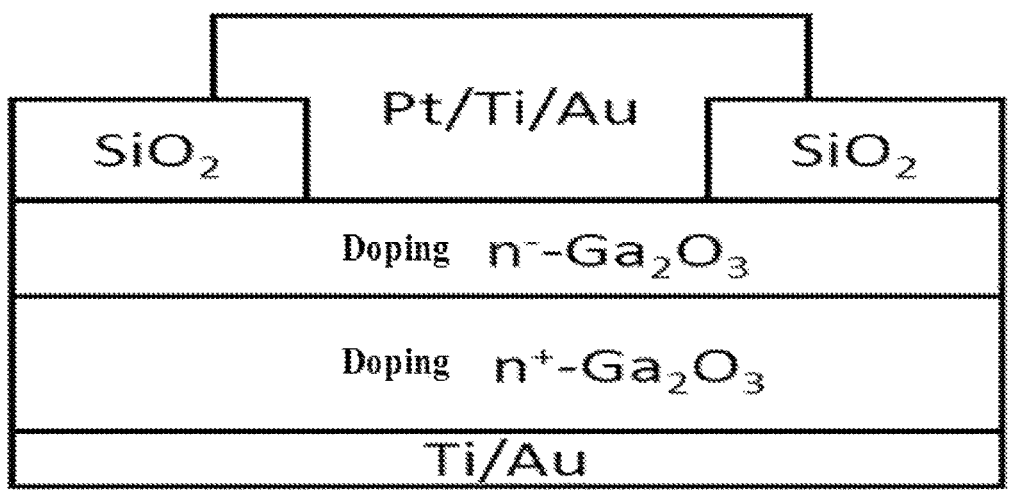
FIG. 1a is a schematic structural diagram of a vertical-structure Schottky diode made from a gallium oxide material in the prior art.
Figure 1B:
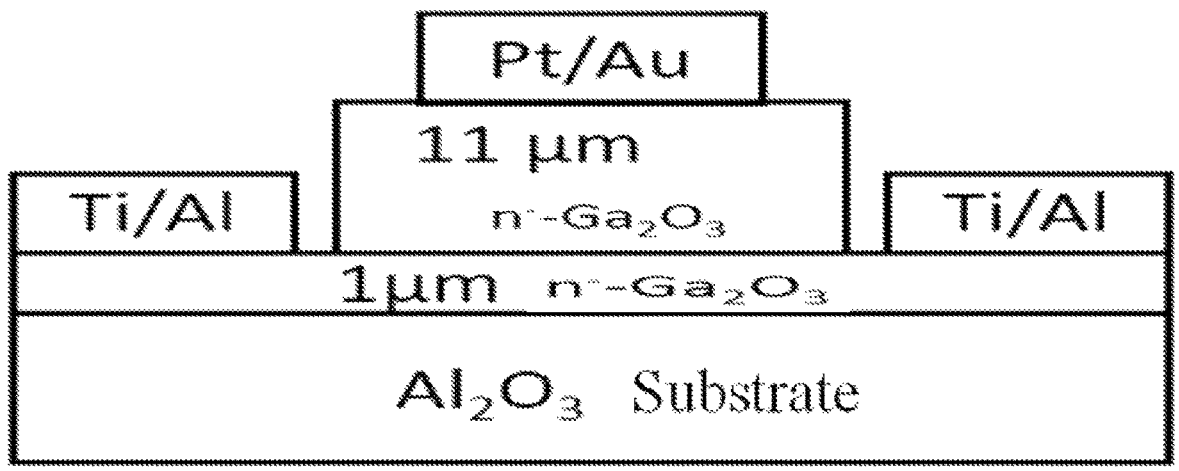
FIG. 1b is a schematic structural diagram of a planar-structure Schottky diode made from a gallium nitride material in the prior art.

The definition of the Schottky diode is known by a person skilled in the art, and the Schottky diode is a low-power-consumption and ultrahigh-speed semiconductor device. The metal semiconductor device is manufactured generally by using a metal (such as gold, silver, aluminium, platinum and the like) electrode as a positive electrode (anode) and an n-type semiconductor as a negative electrode (cathode) based on rectifying properties of potential barrier formed on a contact surface of the anode and the cathode. The n-type semiconductor has a large amount of electrons, and the metal electrode merely has a small amount of free electrons, so the electrons diffuse from the n-type semiconductor to the metal electrode. With continuous diffusion of the electrons, electric neutrality of the contact surface is broken to form the potential barrier, and its electric field direction is from the semiconductor to the metal electrode. However, under the action of the electric field, the electrons also generate reverse drift motion so as to weaken the electric field formed by the diffusion motion. After a space charge region with a certain width is established, an electron drift motion caused by the electric field and an electron diffusion motion caused by different concentrations are relatively balanced so as to form Schottky potential barrier. Compared with the traditional p-n junction diode, the Schottky diode has the advantages of high switching frequency and low forward voltage drop. A reverse recovery time is very short (can be a few nanoseconds), a forward conduction voltage drop is only amount 0.4 V, and the Schottky diode is mostly utilized as a high-frequency, low-voltage and large-current rectifier diode, a flyback diode and a protection diode, is also utilized as the rectifier diode and a small signal detection diode in a microwave communication circuit and the like, and is common in circuits of a communication power supply, a frequency converter and the like. As described above, the existing Schottky diode basically has a vertical structure and a planar structure, and the most has the vertical structure, wherein the vertical structure of the Schottky diode sequentially comprises an anode metal electrode, an n-type semiconductor and a cathode metal electrode from top to bottom. Generally the anode metal electrode and the n-type semiconductor are Schottky electrodes to form a Schottky heterojunction, and the cathode metal electrode generally is ohmic contact. By taking a gallium oxide Schottky diode in FIG. 1a for an example, Pt/Ti/Au forms anode metal, and a Si-doped channel layer and a Sn-doped substrate form the n-type semiconductor and are in contact; and by virtue of high concentration of electrons in an n-type gallium oxide material on an interface, the electrons diffuse into the Pt/Ti/Au anode metal to form a diffusion current, and after the electrons diffuse to a certain extent, a built-in electric field opposite to the diffusion current is formed between the anode metal electrode and the gallium oxide material such that dynamic balance is achieved with the diffusion current to form the Schottky potential barrier. In FIG. 1a, $SiO_2$ is used for releasing an electric field intensity of the anode metal under high voltage and increasing breakdown voltage. The cathode electrode formed by Ti/Au is located at a low end of the device and forms an excellent ohmic contact with the Sn-doped n-type gallium oxide substrate. When a forward bias is applied to two ends (a top end anode metal is connected with a positive electrode of a power supply while a low end cathode metal is connected with a negative electrode of the power supply) of the Schottky potential barrier, the Schottky potential barrier turns narrow, an internal resistance turns small, and the device is on forward; otherwise, when a reverse bias is applied to the two ends of the Schottky potential barrier, the Schottky potential barrier turns high, the internal resistance turns large, and the device is off. A planar-structure Schottky diode has the same working principle with the vertical-structure Schottky diode. By taking the planar-structure Schottky diode based on a gallium nitride material in FIG. 1b for an example, a Pt/Au anode metal electrode and an n− gallium nitride material of 11 microns are in Schottky contact to form a Schottky heterojunction, and an n+ gallium nitride material of 1 micron forms a conducting layer to form the ohmic contact with the Ti/Al cathode metal. When a forward bias is applied to two ends of the Schottky potential barrier, current passes through a Pt/Au anode metal, the n− gallium nitride material, the n+ gallium nitride material and the Ti/Al cathode metal, the Schottky potential barrier turns narrow, the internal resistance turns small, and the device is on forward; otherwise, when a reverse bias is applied to the two ends of the Schottky potential barrier, the Schottky potential barrier turns high, the internal resistance turns large, and the device is off. However, no matter that the existing Schottky diode has the planar structure or the vertical structure, it has defects by virtue of scattering mechanisms, including semiconductor material ionized impurity scattering, optical wave scattering and acoustic wave scattering generated by lattice vibrations, intervalley scattering, dislocation scattering and the like.

Further, the semiconductor nano bump portion and the first electrode form the Schottky contact.

Further, the Schottky diode comprises a nano bump portion array formed by a plurality of semiconductor nano bump portions which are distributed at intervals.

Further, insulating dielectrics are filled in the intervals in the nano bump portion array.

Preferably, the insulating dielectric comprises air, silicon oxide or silicon nitride, but is not limited thereto.

Further, a bottom end of the semiconductor nano bump portion and the first surface of the conducting substrate form the ohmic contact while a top end thereof and the first electrode form the Schottky contact.

Further, the second surface of the conducting substrate and the second electrode form the ohmic contact.

Further, the material of the semiconductor nano bump portion comprises an n-type or p-type or intrinsic semiconductor.

Further, the material of the semiconductor nano bump portion comprises Si, GaN, GaAs, ZnO, $Ga_2O_3$ or SiC, but is not limited thereto.

Further, the shape of the semiconductor nano bump portion comprises any one element or a combination of more than two elements selected from a group of a cylinder, a truncated cone, a cone and a pyramid, but is not limited thereto; for example, the semiconductor nano bump portion can be a semiconductor nanopillar.

By virtue of the above design, compared with the prior art, the Schottky diode provided by the embodiment of the present disclosure at least has the following advantages:

(1), compared with the traditional Schottky diode in which carriers are transported in a diffusion manner, the ballistic transport Schottky diode based on a nano array provided by the embodiment of the present disclosure has the advantage that: the height, namely an effective channel length L of the device, of a vertical-structure semiconductor nanopillar is less than or equal to a mean free path λ, so carriers in the device are transported in a ballistic transport manner or a quasi-ballistic transport manner;

(2), by virtue of the ballistic transport, the carriers in the device are not influenced by various scattering mechanisms in a transporting procedure so that the Schottky diode has a lower on-resistance;

(3), by virtue of the ballistic transport, the carriers in the device are not influenced by the various scattering mechanisms in the transporting procedure so that loss caused by the carriers in the transporting procedure is largely reduced, working loss is reduced, and the cooling system can be simplified;

(4), by virtue of the ballistic transport, the carriers in the device are not influenced by the various scattering mechanisms in the transporting procedure so that the saturated drift velocity of the carriers are increased and the working frequency of the device is improved;

(5), the height of the vertical-structure semiconductor nanopillar is less than the mean free path λ so that the size of the device is reduced, and then the device is more convenient in an integrating procedure; and (6), utilization of a nanopillar array facilitates reduction of the internal defect density of a material to reduce defect-caused electron capture effect.

Figure 2A:
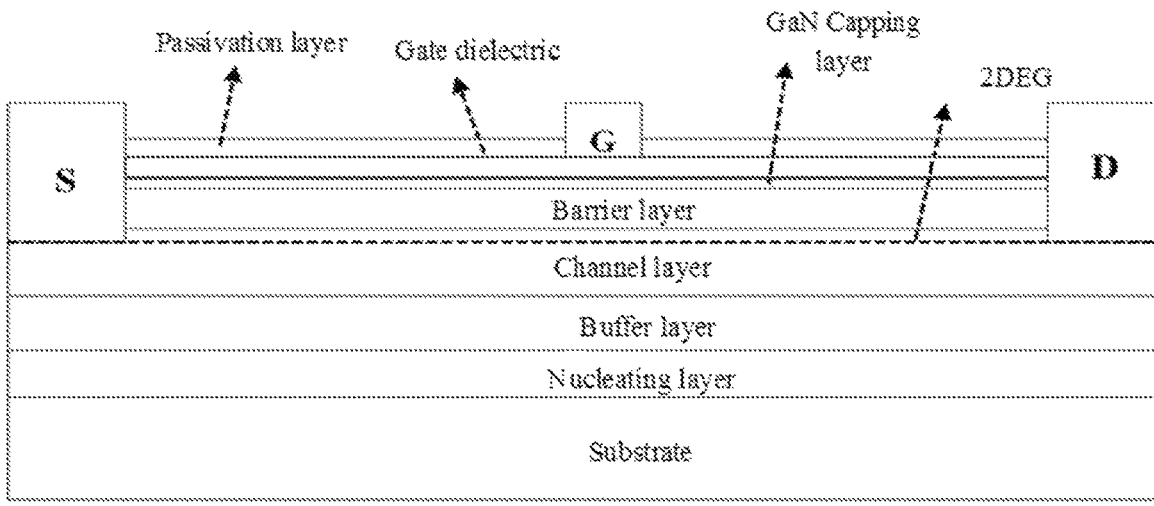
FIG. 2a is a schematic structural diagram of a lateral high-electron-mobility transistor (HEMT) device in the prior art.
Figure 2B:
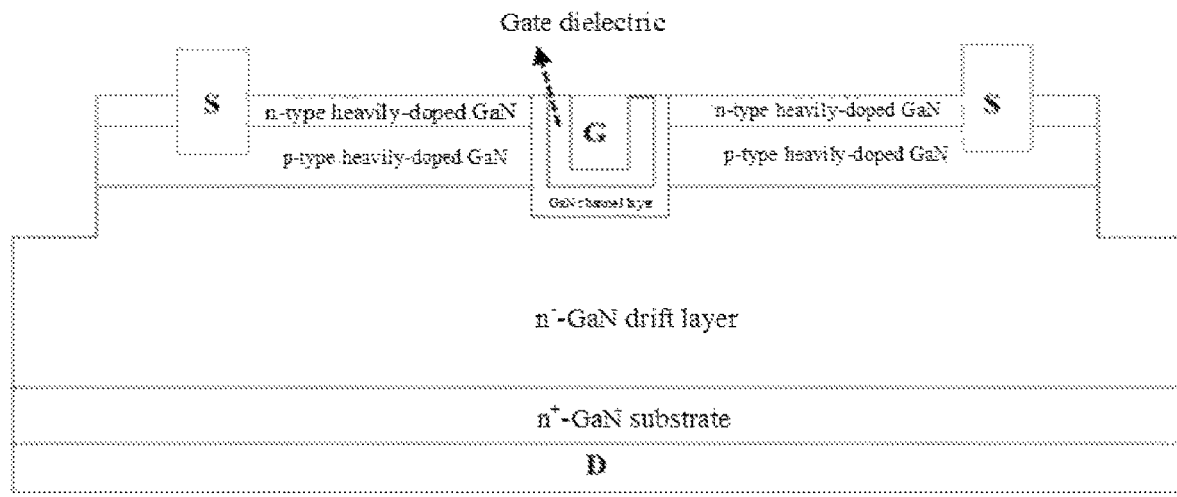
FIG. 2b is a schematic structural diagram of a vertical trench metal-oxide-semiconductor field-effect transistor (trench MOSFET) device in the prior art.

In some embodiment, the semiconductor device is a lateral transistor (such as HEMT). In the existing lateral HEMT, a AlGaN/GaN heterojunction forms high-electron-mobility and high-density two-dimensional electron gas (2DEG), and the gate can be used for controlling on and off of a two-dimensional electron gas channel so as to achieve a function of turning on or off the device. A current collapse and the like in the lateral HEMT may influence long-term reliability of the device. However, to a vertical gallium nitride device, its breakdown voltage can be largely increased with the increasing of the thickness of a drift layer in the device, and it also has a lower dynamic on resistance, so a higher current density can be achieved, and package and integration are easier to be achieved. Therefore, in a medium-high power application field, there are multiple researches and designs about the vertical gallium nitride device. One of the technical solution of the existing power electronic switching device is shown in FIG. 2a. A structure of a lateral high-electron-mobility transistor (HEMT) device mainly comprises a substrate, a nucleating layer, a buffer layer, a channel layer, a barrier layer, a capping layer, a gate dielectric layer, a passivation layer, an ohmic contact and a gate electrode, wherein a source metal electrode S, a drain metal electrode D, a source and a drain form the ohmic contact with the 2DEG in the material, voltage between the source and the drain forms a lateral electric field, and a gate metal electrode G utilizes a gate voltage consumption function to control on and off of a two-dimensional electron gas channel at the AlGaN/GaN heterojunction. As shown in FIG. 2b, the structure of the existing vertical trench metal-oxide-semiconductor field-effect transistor (trench MOSFET) device mainly comprises a source metal electrode, a drain metal electrode, a source metal electrode, a drift layer, a channel layer and a substrate. The drain and the n-type GaN form the ohmic contact, the current sequentially flows through the source S, the GaN channel layer and the gallium nitride drift layer and finally reaches the drain D, and the gate G utilizes the gate voltage to control on and off of the device. Similarly, no matter that the existing transistor has the lateral structure or the vertical structure, its performance is unavoidably influenced by the scattering mechanisms.

Further, the vertical transistor further comprises three electrodes, and any of the first electrode and the second electrode is the drain, the other is the source, the third electrode is the gate, the semiconductor nano bump portion comprises a conducting channel, the source, the gate and the drain are sequentially arranged in a length direction of the semiconductor nano bump portion at intervals, the source and the drain are electrically connected through the conducting channel, the gate is arranged around the semiconductor nano bump portion, the gate and the semiconductor nano bump portion match with each other to form a Schottky heterojunction, and an effective length of the conducting channel is less than a mean free path of a carrier.

Further, the top end of the semiconductor nano bump portion and any of the source and the drain form the ohmic contact.

Further, the other one of the source and the drain and a second surface of the conducting substrate form the ohmic contact.

Further, a dielectric layer is distributed between the gate and the semiconductor nano bump portion.

Further, a dielectric layer is arranged between the gate and the source and/or the drain.

Preferably, the material of the dielectric layer comprises aluminium oxide or silicon nitride, but is not limited thereto.

Further, the material of the semiconductor nano bump portion comprises any one element or a combination of more than two elements selected from a group of GaN, $Ga_2O_3$, SiC and ZnO, but is not limited thereto.

Further, the shape of the semiconductor nano bump portion comprises any one element or a combination of more than two elements selected from a group of a cylinder, a truncated cone, a cone and a pyramid, but is not limited thereto; for example, the semiconductor nano bump portion can be a semiconductor nanopillar.

By virtue of the above design, compared with the prior art, the vertical transistor provided by the embodiment of the present disclosure at least has the following advantages:

(1), to a ballistic transport vertical transistor based on a nano array provided by an embodiment of the present disclosure, the height, namely an effective channel length L of the device, of a vertical-structure semiconductor nanopillar is less than a mean free path $\lambda$, so carriers in the device are transported in a ballistic transport manner;

(2), by virtue of the ballistic transport, the carriers in the device are not influenced by various scattering mechanisms in a transporting procedure so that the semiconductor device has a lower on-resistance;

(3), by virtue of the ballistic transport, the carriers in the device are not influenced by the various scattering mechanisms in the transporting procedure so that loss caused by the carriers in the transporting procedure is largely reduced, working loss is reduced, and the cooling system can be simplified;

(4), by virtue of the ballistic transport, the carriers in the device are not influenced by the various scattering mechanisms in the transporting procedure so that the saturated drift velocity of the carriers are increased and the working frequency of the device is improved; and (5), the height of the vertical-structure semiconductor nanopillar is less than the mean free path $\lambda$ so that the size of the device is reduced, and then the device is more convenient in an integrating procedure.

An embodiment of the present disclosure further provides a manufacturing method of a ballistic transport semiconductor device based on nano array, which comprises:

arranging at least one semiconductor nano bump portion on a first surface of a conducting substrate, and electrically connecting the semiconductor nano bump portion and the first surface of the conducting substrate, wherein the height of the semiconductor nano bump portion is less than or equal to a mean free path of a carrier;

manufacturing a first electrode, and electrically connecting the semiconductor nano bump portion and the first electrode; and manufacturing a second electrode, and electrically connecting the second electrode and a second surface of the conducting substrate, wherein the first surface and the second surface are arranged back to back.

In some embodiments, the semiconductor device is a Schottky diode, its first electrode is an anode, and its second electrode is a cathode.

Further, a manufacturing method of the Schottky diode comprises: forming a semiconductor layer on the first surface of the conducting substrate, processing the semiconductor layer to form at least one semiconductor nano bump portion; or directly epitaxially growing to form at least one semiconductor nano bump portion on the first surface of the conducting substrate.

Further, the manufacturing method of the Schottky diode specifically comprises:

forming a semiconductor layer on the first surface of the conducting substrate, processing the semiconductor layer to form a precursor of at least one semiconductor nano bump portion; or directly epitaxially growing to form a precursor of at least one semiconductor nano bump portion on the first surface of the conducting substrate; and conducting a physical and/or chemical process on the precursor of the at least one semiconductor nano bump portion so as to form the at least one semiconductor nano bump portion.

Further, the manufacturing method of the Schottky diode specifically comprises: arranging a nano bump portion array formed by a plurality of semiconductor nano bump portions, which are distributed at intervals, on the first surface of the conducting substrate.

Further, the manufacturing method of the Schottky diode comprises: filling insulating dielectrics in the intervals in the nano bump portion array, wherein preferably, the insulating dielectric comprises air, silicon oxide or silicon nitride, but is not limited thereto.

Further, a bottom end of the semiconductor nano bump portion and the first surface of the conducting substrate form the ohmic contact while a top end thereof and the first electrode form the Schottky contact.

Further, the second surface of the conducting substrate and the second electrode form the ohmic contact.

In some embodiments, the semiconductor device is a vertical transistor, a manufacturing method of the vertical transistor further comprises manufacturing three electrodes, wherein any of the first electrode and the second electrode is the drain, the other is the source, the third electrode is the gate, the semiconductor nano bump portion comprises a conducting channel, the source, the gate and the drain are sequentially arranged in a length direction of the semiconductor nano bump portion at intervals, the source and the drain are electrically connected through the conducting channel, the gate is arranged around the semiconductor nano bump portion, the gate and the semiconductor nano bump portion match with each other to form a Schottky heterojunction, and an effective length of the conducting channel is less than a mean free path of a carrier.

Further, the first electrode and the top end of the semiconductor nano bump portion form the ohmic contact, and the second electrode and the second surface of the conducting substrate form the ohmic contact.

Further, the manufacturing method of the vertical transistor further comprises: manufacturing a dielectric layer between the third electrode and the semiconductor nano bump portion.

Further, the manufacturing method of the vertical transistor further comprises: manufacturing a dielectric layer between the third electrode and the first electrode and/or the second electrode, wherein preferably, the material of the dielectric layer comprises aluminum oxide or silicon nitride, but is not limited thereto.

Further, the shape of the semiconductor nano bump portion comprises any one element or a combination of more than two elements selected from a group of a cylinder, a truncated cone, a cone and a pyramid.

Further, the material of the semiconductor nano bump portion comprises an n-type or p-type or intrinsic semiconductor.

Preferably, the material of the semiconductor nano bump portion comprises any one element or a combination of more than two elements selected from a group of Si, GaN, GaAs, ZnO, $Ga_2O_3$ and SiC, but is not limited thereto.

The following further explains and describes the technical solution, implementation processes and principles of the present disclosure with reference to the accompanying drawings.

Figure 8:
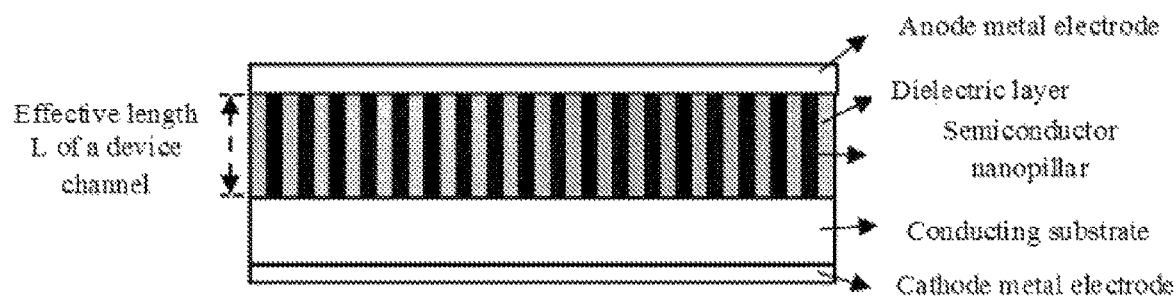
FIG. 8 is a schematic structural diagram of a ballistic transport Schottky diode based on a nano array in a first embodiment of the present disclosure.

Referring to FIG. 8, a ballistic transport Schottky diode based on a nano array provided by a typical embodiment of the present disclosure comprises: a conducting substrate, a plurality of vertical-structure n-type semiconductor nanopillars (namely the semiconductor nano bump portions) distributed at an upper portion of the conducting substrate at intervals, an anode metal electrode (namely the first electrode) arranged above the vertical-structure n-type semiconductor nanopillar, and a cathode metal electrode (namely the second electrode) arranged at a lower portion of the conducting substrate, the cathode metal electrode forms the ohmic contact with the vertical-structure n-type semiconductor nanopillar through the conducting substrate, the vertical-structure n-type semiconductor nanopillar forms Schottky contact with the anode metal electrode, and a dielectric layer is also filled in a cavity between every two adjacent vertical-structure n-type semiconductor nanopillars; wherein the vertical-structure n-type semiconductor nanopillar is utilized as an effective channel of the Schottky diode (or called a device), and the height of the vertical-structure n-type semiconductor nanopillar is less than a mean free path of the carrier. For example, the height of the vertical-structure n-type GaN nanopillar is equal to 150 nm.

Figure 3A:
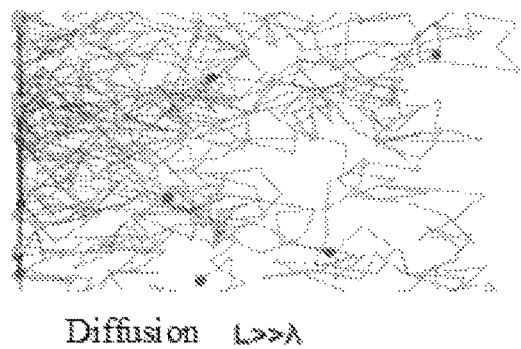
FIG. 3a is a schematic diagram of motion manners of carriers when an effective channel length L of a device is greater than a mean free path $\lambda$ of the carriers.
Figure 3B:
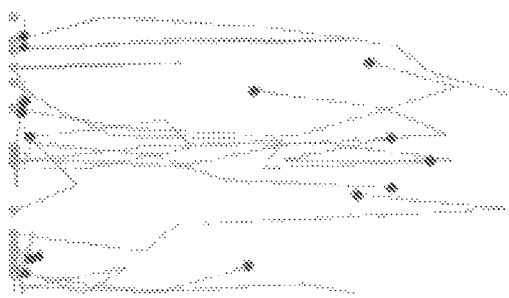
FIG. 3b is a schematic diagram of motion manners of carriers when an effective channel length L of a device is equal to a mean free path $\lambda$ of the carriers.
Figure 3C:
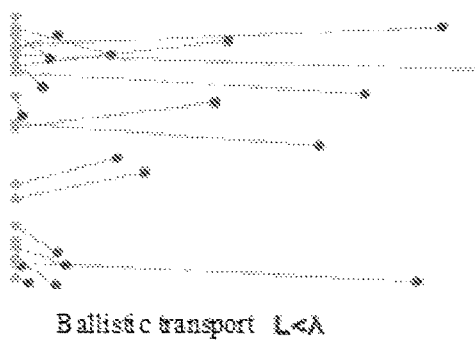
FIG. 3c is a schematic diagram of motion manners of carriers when an effective channel length L of a device is less than a mean free path $\lambda$ of the carriers.

When current flows in the semiconductor device (which is called a device for short below), actually carriers (electrons or cavities) in the device generate directional motion in the device, the carriers generate scattering in the transporting procedure by virtue of various reasons, such as ionized impurity scattering, optical wave scattering and acoustic wave scattering generated by lattice vibrations, intervalley scattering, dislocation scattering and the like, and the scattering causes speed reduction and loss increase of the carriers in the transporting procedure. The ballistic transport is the transport of the carriers in the semiconductor material or the device without any hindering factors such as collision or scattering to pass through a special region of the material or the device so as to achieve high-speed and large-current transport. When the size of the device is shorten to be equal to a mean free motion distance, namely a mean free path A, of the carrier in an actual device material, the carrier can achieve unobstructed transport in the device without being influenced by the scattering, that is, the carrier achieves the ballistic transport. As shown in FIGS. 3a, 3b and 3c, when the effective channel length L of the device is greater than the mean free path λ, the carrier is transported in a diffusion manner; when the effective channel length L of the device is equal to the mean free path λ, the carrier is transported in a quasi-ballistic transport manner; and when the effective channel length L of the device is less than the mean free path λ, the carrier is transported in a ballistic transport manner to achieve ultra low conducting loss and switching loss.

The mean free path λ of the carrier generally is less than 1 micron; when the effective channel length L of the device is less than the mean free path λ, the carrier is transported in the device in the ballistic transport manner, at this time, the transport of the carrier does not use the diffusion manner and is not influenced by various scattering mechanisms to increased the saturated drift speed of the carrier and form quantum interference in a ballistic transport region so as to achieve lower on resistance of the device, high working frequency and less working energy consumption. By taking the ballistic transport Schottky diode based on the nano array shown in FIG. 8 for an example, when the height of the vertical-structure n-type semiconductor nanopillar, that is the effective channel length L of the device, is less than or equal to the mean free path λ of the carrier, the carrier is transported among the semiconductor nanopillars in the ballistic transport manner or the quasi-ballistic transport manner, thereby achieving the Schottky diode with lower on resistance, high working frequency, and less working energy consumption and smaller device size.

Figure 4:
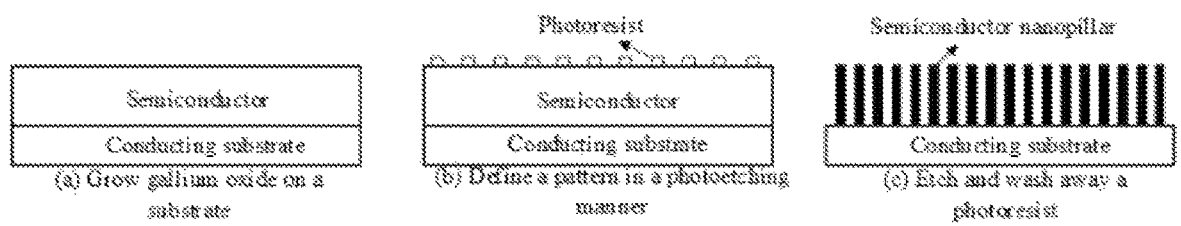
FIG. 4 is a schematic diagram of a processing and manufacturing flow of a vertical-structure semiconductor nanopillar in a first embodiment of the present disclosure.
Figure 5:
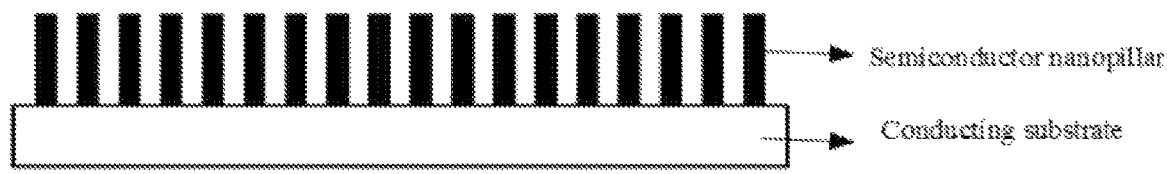
FIG. 5 is a schematic structural diagram of a device after an anode metal electrode is manufactured in a first embodiment of the present disclosure.
Figure 6:
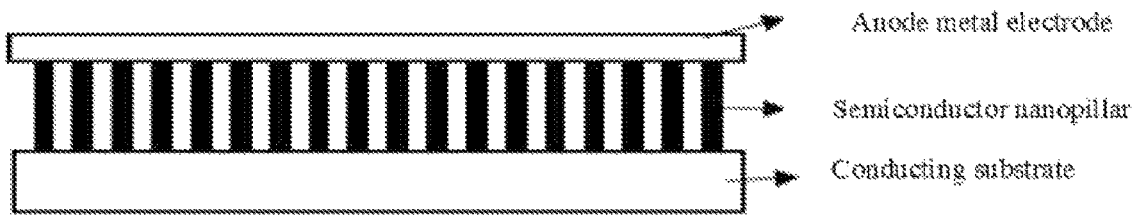
FIG. 6 is a schematic structural diagram of a device after a cathode metal electrode is manufactured in a first embodiment of the present disclosure.
Figure 7:
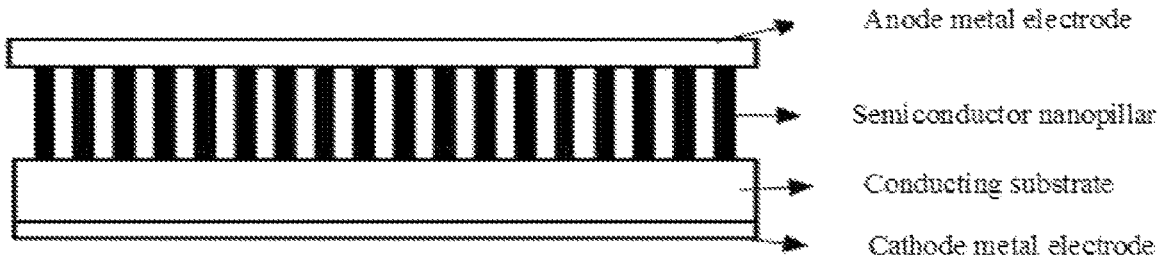
FIG. 7 is a schematic structural diagram of a ballistic transport Schottky diode based on a nano array in a first embodiment of the present disclosure.

In a first embodiment of the present disclosure, the structure of the ballistic transport Schottky diode based on a nano array can refer to FIG. 7 or FIG. 8, and its manufacturing method may comprise the following steps:

(1), manufacturing a vertical-structure semiconductor nanopillar: growing a semiconductor film material (such as gallium oxide) on an upper surface of a conducting substrate by utilizing epitaxy technologies including metalorganic chemical vapour deposition (MOCVD) or molecular beam epitaxy (MBE) or hydride vapour phase epitaxy (HVPE) and the like, wherein the thickness of the film is less than or equal to the mean free path λ of the carrier; defining a pattern on the surface of the semiconductor film by utilizing a photoetching technology, and etching the semiconductor film from a planar structure to a cylindrical array structure, wherein the specific flow is shown in FIG. 4a-b-c; or directly growing a vertical-structure semiconductor nanopillar, the height of which is less than or equal to the mean free path A of the carrier, on the conducting substrate by utilizing the epitaxy technologies including metalorganic chemical vapour deposition (MOCVD) or molecular beam epitaxy (MBE) or hydride vapour phase epitaxy (HVPE) and the like, wherein the specific flow is shown in FIG. 4d;

(2), filling a dielectric layer in a cavity of the semiconductor nanopillar, wherein the material of the dielectric layer comprises air, $SiO_2$ or SiN and the like;

(3), removing the dielectric layer deposited on the upper surface of the semiconductor nanopillar to expose the upper surface of the semiconductor nanopillar, manufacturing an anode metal electrode on the semiconductor nanopillar by utilizing a metal deposition technology such as electron beam evaporation or sputtering and the like, and ensuring the anode metal electrode and the semiconductor nanopillar to form Schottky contact, wherein the structure of a device after the anode metal electrode is manufactured is shown in FIG. 5; and (4), manufacturing a cathode metal electrode on a back surface (namely a lower surface) of the semiconductor nanopillar by utilizing the metal deposition technology such as the electron beam evaporation or sputtering and the like, and ensuring the cathode metal electrode and the semiconductor nanopillar to form ohmic contact through a conducting substrate to form the cathode metal electrode.

In a second embodiment of the present disclosure, the structure of the ballistic transport Schottky diode based on a nano array can refer to FIG. 7 or FIG. 8, its manufacturing method is basically consistent with the manufacturing method in the above embodiment.

The vertical-structure semiconductor nanopillar in the ballistic transport Schottky diode based on a nano array provided in the above embodiments of the present disclosure may be an n-type or p-type semiconductor nanopillar, its shape may be any of a cylinder, a truncated cone, a cone and a pyramid, but is not limited thereto, and its material may be any of Si, GaN, GaAs, ZnO, $Ga_2O_3$ and SiC, but is not limited thereto. Wherein the material of the anode metal electrode may be a material such as Cr, Pt, Ti, Au and the like well known by a person skilled in the art, such as Ti/Au (which means a sequentially laminated Ti layer and Au layer); the material of the cathode metal electrode may be a material such as Ti/Al (which means a sequentially laminated Ti layer and Al layer) and the like well known by a person skilled in the art; and the material of the conducting substrate may be a material such as silicon, silicon carbide, graphene and the like well known by a person skilled in the art.

Figure 9:
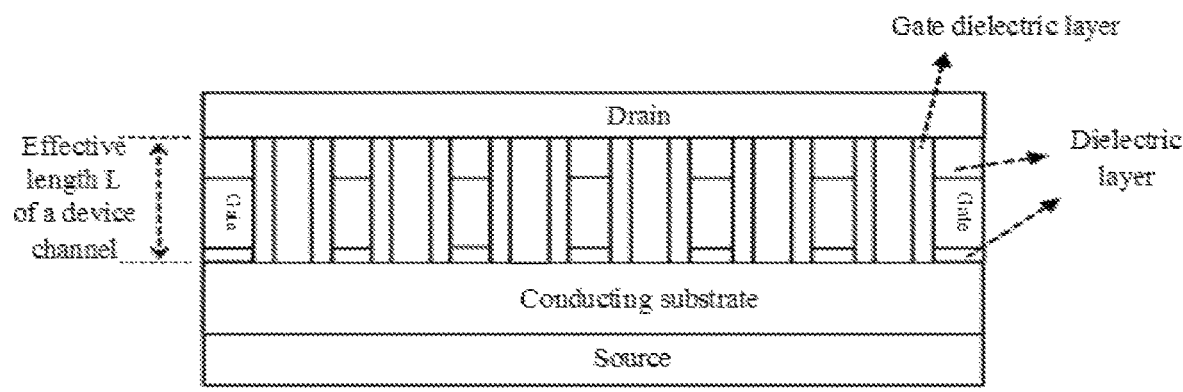
FIG. 9 is a schematic structural diagram of a ballistic transport vertical transistor based on a nano array in a third embodiment of the present disclosure.

Referring to FIG. 9, a ballistic transport vertical transistor based on a nano array provided by another typical embodiment of the present disclosure comprises: a conducting substrate, a plurality of vertical-structure semiconductor nanopillars (namely the semiconductor nano bump portions) distributed at an upper portion (namely the first surface) of the conducting substrate at intervals, a drain electrode arranged above the vertical-structure semiconductor nanopillars, a source electrode arranged at a lower portion (namely the second surface) of the conducting substrate, and gate electrodes arranged between the first electrode and the conducting substrate, the source electrode and the vertical-structure semiconductor nanopillar form ohmic contact through the conducting substrate, the drain electrode and a top end of the vertical-structure semiconductor nanopillar form the ohmic contact, and the vertical-structure semiconductor nanopillar and the gate electrode form Schottky potential barrier; a gate lower dielectric layer is arranged between the gate electrode and the conducting substrate, a gate-drain dielectric layer is arranged between the gate electrode and the drain electrode, a gate electrode dielectric layer (namely a gate dielectric layer) is arranged between the gate electrode and the vertical-structure semiconductor nanopillar, and the gate dielectric layers are distributed among the gate electrode, the gate lower dielectric layer, the gate-drain dielectric layer and the vertical-structure semiconductor nanopillar; wherein the vertical-structure semiconductor nanopillar is utilized as the effective channel of the vertical transistor (or the device), and the height of the vertical-structure semiconductor nanopillar is less than the mean free path of the carrier; for example, the height of the vertical-structure semiconductor nanopillar is less than 1 micron.

In a micro perspective view, when current flows in the device, actually the carriers (electrons or cavities) in the device generate directional motion in the device, the carriers generate scattering in the transporting procedure by virtue of various reasons, such as ionized impurity scattering, optical wave scattering and acoustic wave scattering generated by lattice vibrations, intervalley scattering, dislocation scattering and the like, and the scattering causes unfavourable factors such as speed reduction, loss increase and the like of the carriers in the transporting procedure. The ballistic transport is the transport of the carriers in the semiconductor material or the device without obstruction such as collision or scattering to pass through a special region of the material or the device so as to achieve higher-speed and larger-current transport. When the size of the device is shorten to be equal to a mean free motion distance, namely a mean free path $\lambda$, of the carrier in an actual device, the carrier can achieve unobstructed transport in the device without being influenced by the scattering, that is, the carrier achieves the ballistic transport. As shown in FIGS. 3a, 3b and 3c, when the effective channel length L of the device is greater than the mean free path $\lambda$, the carrier is transported in a diffusion manner; when the effective channel length L of the device is equal to the mean free path $\lambda$, the carrier is transported in a quasi-ballistic transport manner; and when the effective channel length L of the device is less than the mean free path $\lambda$, the carrier is transported in a ballistic transport manner to achieve ultra low conducting loss and switching loss. Researches of a ballistic transport device with a nano line and a nano structure and application thereof in a high-frequency and low-power-consumption semiconductor device have huge potential and advantages.

The mean free path $\lambda$ of the carrier generally is less than 1 micron; when the effective channel length L of the device is less than the mean free path $\lambda$, the carrier is transported in the device in the ballistic transport manner, at this time, the transport of the carrier does not use the diffusion manner and is not influenced by various scattering mechanisms to increase the saturated drift speed of the carrier and form quantum interference in a ballistic transport region so as to achieve lower on resistance of the device, high working frequency and less working energy consumption.

Figure 10:
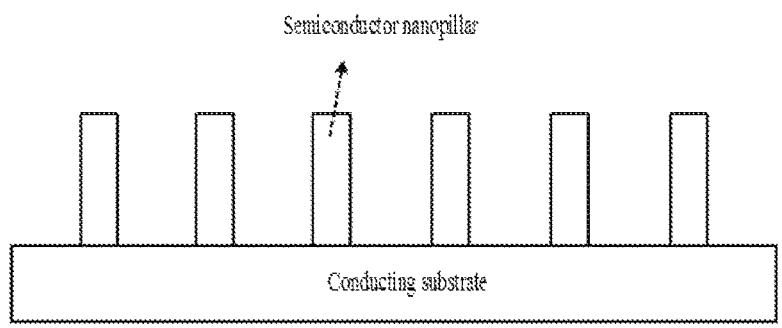
FIG. 10 is a schematic structural diagram after a vertical-structure semiconductor nanopillar is manufactured in a third embodiment of the present disclosure.
Figure 11:
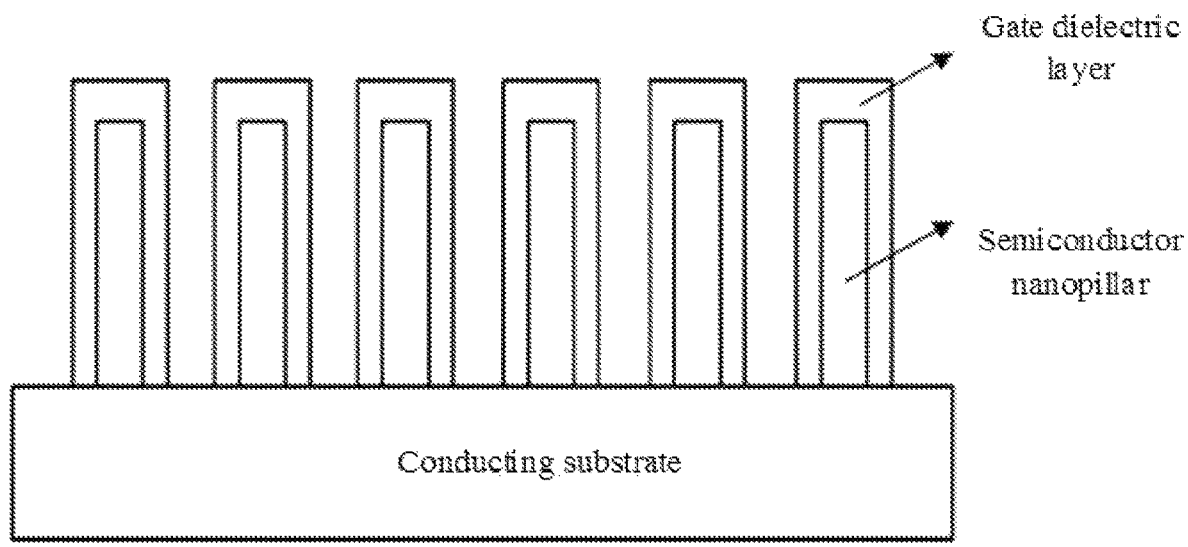
FIG. 11 is a schematic structural diagram after a gate dielectric layer is manufactured in a third embodiment of the present disclosure.
Figure 12:
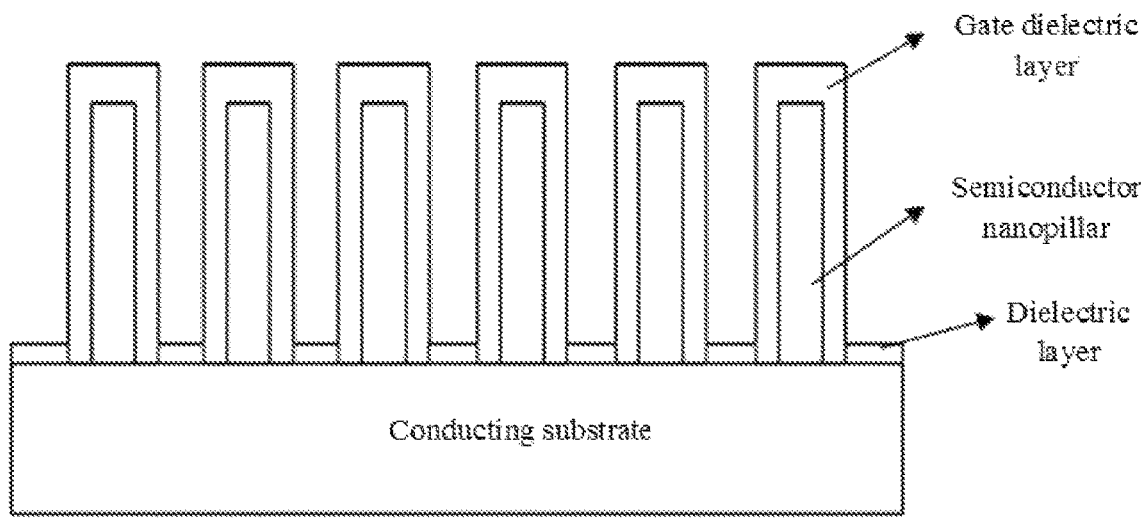
FIG. 12 is a schematic structural diagram after a gate lower dielectric layer is manufactured in a third embodiment of the present disclosure.
Figure 13:
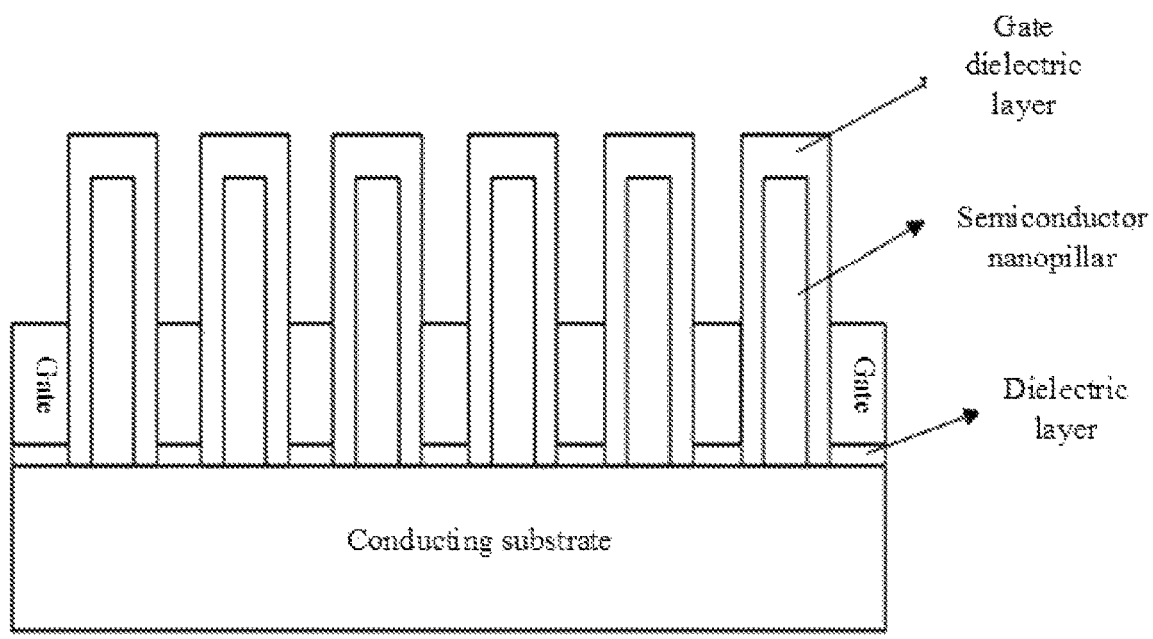
FIG. 13 is a schematic structural diagram after a gate electrode is manufactured in a third embodiment of the present disclosure.
Figure 14:
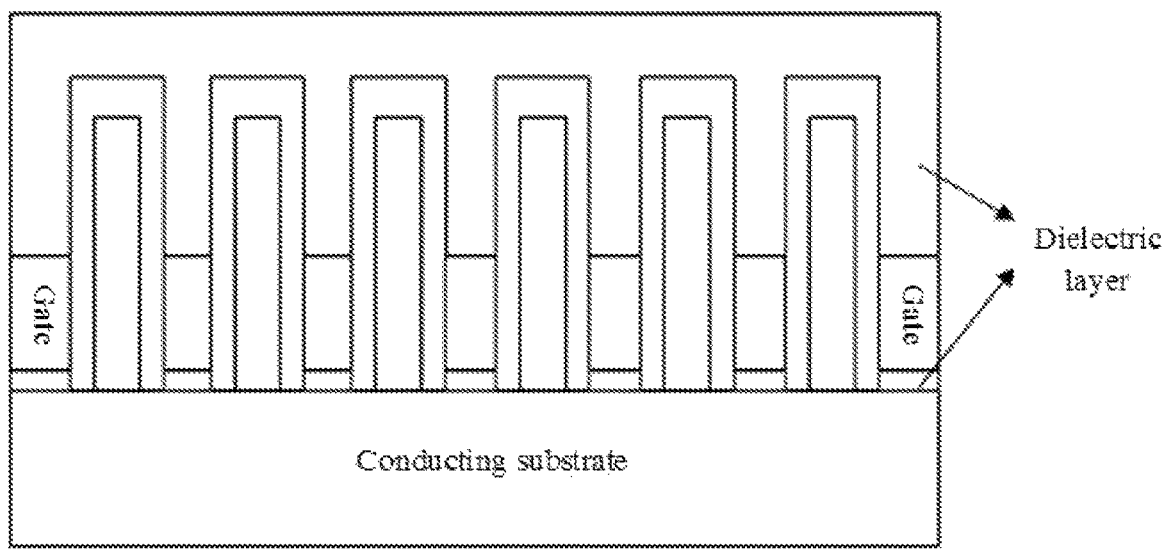
FIG. 14 is a schematic structural diagram after a gate-drain dielectric layer is manufactured in a third embodiment of the present disclosure.
Figure 15:
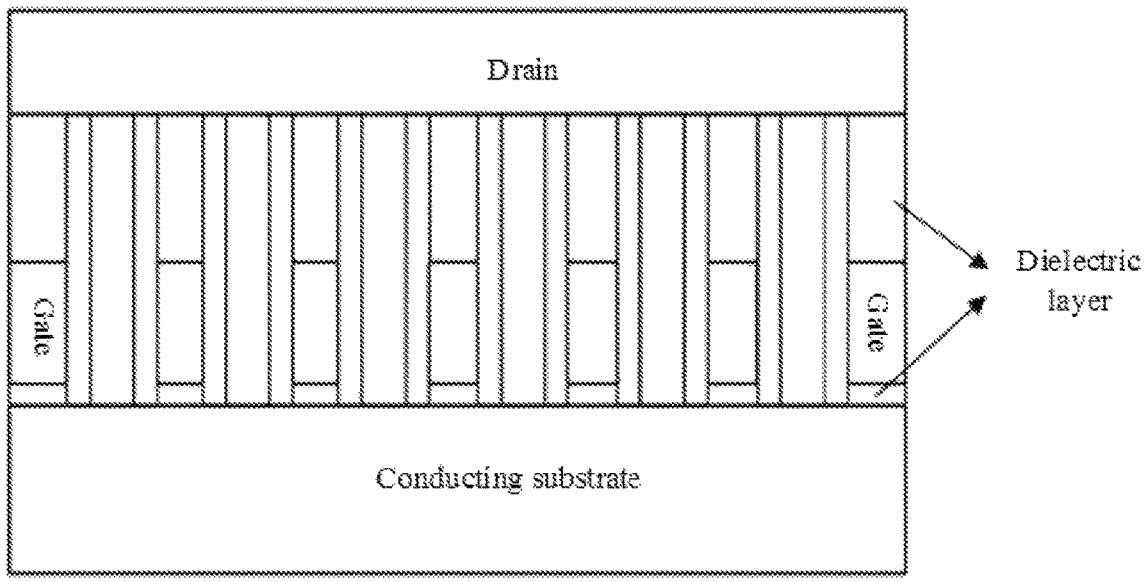
FIG. 15 is a schematic structural diagram after a drain electrode is manufactured in a third embodiment of the present disclosure.
Figure 16:
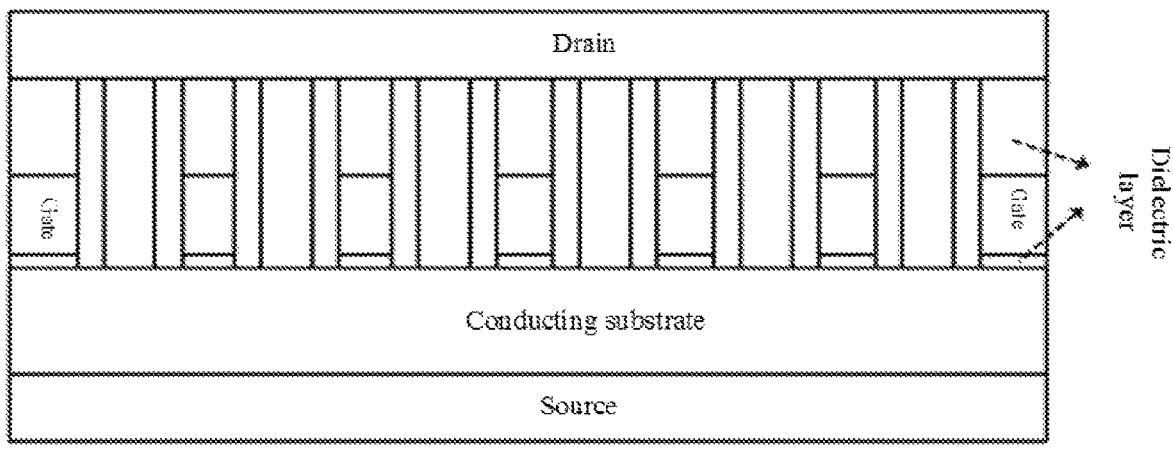
FIG. 16 is a schematic structural diagram after a source electrode is manufactured in a third embodiment of the present disclosure.

In a third embodiment of the present disclosure, the structure of the ballistic transport vertical transistor based on a nano array is shown in FIG. 9, and its manufacturing method may comprise the following steps:

(1), manufacturing a vertical-structure semiconductor nanopillar: growing a plurality of vertical-structure semiconductor nanopillars, the height of which is less than the mean free path A of the carrier, on an upper portion of a conducting substrate (such as silicon, SiC or diamond) by utilizing epitaxy technologies including metalorganic chemical vapour deposition (MOCVD) or molecular beam epitaxy (MBE) or atomic layer deposition (ALD) and the like, wherein its structure is shown in FIG. 10;

(2), depositing a gate dielectric layer on a periphery of the vertical-structure semiconductor nanopillar by utilizing the ALD technology and the like, wherein the material of the gate dielectric layer may be $Al_2O_3$ and the like, and a structure after the gate dielectric layer is formed is shown in FIG. 11;

(3), depositing a gate lower dielectric layer between the vertical-structure semiconductor nanopillar and the peripheral dielectric layer above the conducting substrate by utilizing the ALD technology and the like, wherein the material of the gate lower dielectric layer may be $Si_xN_y$ and the like, and its structure is shown in FIG. 12;

(4), manufacturing a gate electrode between outer dielectric layers of the vertical-structure semiconductor nanopillar by utilizing a metal deposition technology such as electron beam evaporation or sputtering and the like, and ensuring that the gate electrode and the vertical-structure semiconductor nanopillar form MIS Gate, wherein its structure is shown in FIG. 13;

(5), depositing a gate-drain dielectric layer on the gate electrode and the gate dielectric layer by utilizing a chemical vapour deposition technology and the like, wherein the material of the gate-drain dielectric layer may be $Si_xN_y$ and the like, and its structure is shown in FIG. 14;

(6), removing two dielectric layers (namely the gate dielectric layer and the gate-drain dielectric layer) at the top of the semiconductor nanopillar in an etching manner by utilizing an ion beam etching technology and the like, manufacturing a drain electrode at the top end of the vertical-structure semiconductor nanopillar, and ensuring that the drain electrode and the semiconductor nanopillar form ohmic contact, wherein its structure is shown in FIG. 15; and (7), manufacturing a source electrode on a back surface (namely the second surface) of the conducting substrate by utilizing the metal deposition technology such as electron beam evaporation or sputtering and the like, and ensuring that the source electrode and the conducting substrate form the ohmic contact, wherein its structure is shown in FIG. 16.

Figure 17:
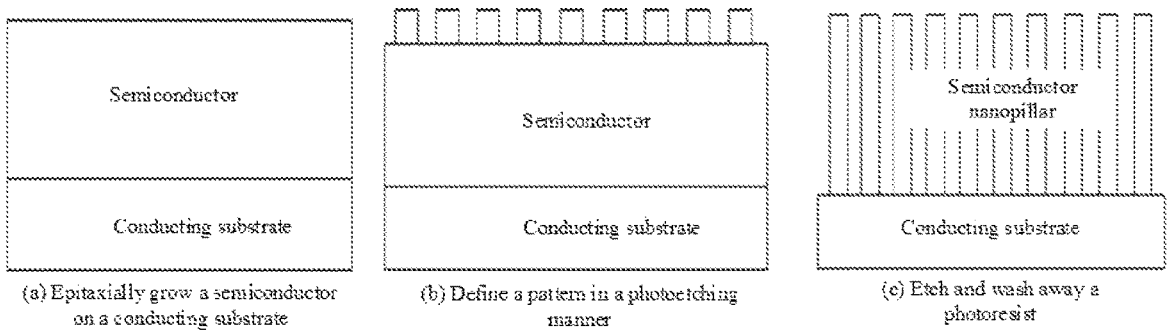
FIG. 17 is a schematic diagram showing a vertical-structure semiconductor nanopillar manufacturing procedure in a fourth embodiment of the present disclosure.

In a fourth embodiment of the present disclosure, the structure of the ballistic transport vertical transistor based on a nano array is shown in FIG. 9, its manufacturing method is basically consistent with the manufacturing method in the third embodiment, and difference is: the manufacturing method of the vertical-structure semiconductor nanopillar comprises: growing a semiconductor film material at an upper portion of the conducting substrate by utilizing the epitaxy technologies including metalorganic chemical vapour deposition (MOCVD) or molecular beam epitaxy (MBE) or hydride vapour phase epitaxy (HVPE) and the like, wherein the thickness of the film is less than the mean free path λ of the carrier; defining a pattern on the surface of the semiconductor by utilizing a photoetching technology, and etching the semiconductor from a planar structure to a cylindrical structure, wherein the specific flow is shown in FIG. 17.

The shape of the vertical-structure semiconductor nanopillar (namely the semiconductor nano bump portion) in the above embodiments of the present disclosure comprises any one element or a combination of more than two elements selected from a group of a cylinder, a cone and a nail, but is not limited thereto, and the material of the vertical-structure semiconductor nanopillar comprises any one element or a combination of more than two elements selected from a group of GaN, $Ga_2O_3$, SiC and ZnO, but is not limited thereto.

The ballistic transport vertical transistor based on a nano array provided by the embodiments of the present disclosure helps the carriers not to be influenced by various scattering mechanisms in the transporting procedure by virtue of the existence of ballistic transport characteristics, therefore, the vertical transistor provided by the embodiments of the present disclosure has lower on resistance, less working power consumption, higher working frequency and smaller device size.

It should be understood that the above embodiments merely illustrate technical conceptions and features of the present disclosure, which aims at enabling persons familiar with this technology to understand and implement the content of the present disclosure, but not intend to limit the protection scope of the present disclosure. Equivalent changes or modifications made according to the spiritual substance of the present disclosure should fall within the protection scope of the present disclosure.

What is claimed is:

1. A ballistic transport semiconductor device based on nano array, comprising a conducting substrate, wherein more than one semiconductor nano bump portion is arranged on a first surface of the conducting substrate, a top end of the semiconductor nano bump portion is electrically connected with a first electrode, a second surface of the conducting substrate is electrically connected with a second electrode, the second surface and the first surface are arranged back to back, and a height of the semiconductor nano bump portion is less than or equal to a mean free path of a carrier;

wherein the ballistic transport semiconductor device based on nano array further comprises a nano bump portion array formed by a plurality of semiconductor nano bump portions which are distributed at intervals, wherein a bottom end of the semiconductor nano bump portion and the first surface of the conducting substrate form ohmic contact while a top end thereof and the first electrode form Schottky contact; and/or the second surface of the conducting substrate and the second electrode form the ohmic contact; and/or the first electrode is an anode, and the second electrode is a cathode.

2. The ballistic transport semiconductor device based on nano array according to claim 1, wherein insulating dielectrics are filled in the intervals in the nano bump portion array; preferably, the insulating dielectric comprises air, silicon oxide or silicon nitride.

3. The ballistic transport semiconductor device based on nano array according to claim 1, further comprising a third electrode, wherein any of the first electrode and the second electrode is a drain, the other is a source, the third electrode is a gate, the semiconductor nano bump portion comprises a conducting channel, the source, the gate and the drain are sequentially arranged in a length direction of the semiconductor nano bump portion at intervals, the source and the drain are electrically connected through the conducting channel, the gate is arranged around the semiconductor nano bump portion, the gate and the semiconductor nano bump portion match with each other to form a Schottky heterojunction, and an effective length of the conducting channel is less than the mean free path of the carrier.

4. The ballistic transport semiconductor device based on nano array according to claim 3, wherein the first electrode and the top end of the semiconductor nano bump portion form the ohmic contact, and the second electrode and the second surface of the conducting substrate form the ohmic contact; and/or a dielectric layer is distributed between the third electrode and the semiconductor nano bump portion; and/or a dielectric layer is arranged between the third electrode and the first electrode and/or the second electrode; preferably, the material of the dielectric layer comprises aluminum oxide or silicon nitride.

5. The ballistic transport semiconductor device based on nano array according to claim 1, wherein a shape of the semiconductor nano bump portion comprises any one element or a combination of more than two elements selected from a group of a cylinder, a truncated cone, a cone and a pyramid; and/or a material of the semiconductor nano bump portion comprises an n-type or p-type or intrinsic semiconductor; preferably, the material of the semiconductor nano bump portion comprises any one element or a combination of more than two elements selected from a group of Si, GaN, GaAs, ZnO, $Ga_2O_3$ and SiC.

6. A manufacturing method of a ballistic transport semiconductor device based on nano array, comprising:
  arranging at least one semiconductor nano bump portion on a first surface of a conducting substrate, and electrically connecting the semiconductor nano bump portion and the first surface of the conducting substrate, wherein a height of the semiconductor nano bump portion is less than or equal to a mean free path of a carrier;
  manufacturing a first electrode, and electrically connecting the semiconductor nano bump portion and the first electrode; and
  manufacturing a second electrode, and electrically connecting the second electrode and a second surface of the conducting substrate, wherein the first surface and the second surface are arranged back to back;
  wherein a bottom end of the semiconductor nano bump portion and the first surface of the conducting substrate form ohmic contact while a top end thereof and the first electrode form Schottky contact; and/or the second surface of the conducting substrate and the second electrode form the ohmic contact; and/or the first electrode is an anode, and the second electrode is a cathode.

7. The manufacturing method according to claim 6, specifically comprising: forming a semiconductor layer on the first surface of the conducting substrate, processing the semiconductor layer to form at least one semiconductor nano bump portion; or epitaxially growing to form at least one semiconductor nano bump portion on the first surface of the conducting substrate.

8. The manufacturing method according to claim 6, specifically comprising:
  forming a semiconductor layer on the first surface of the conducting substrate, processing the semiconductor layer to form a precursor of at least one semiconductor nano bump portion; or directly epitaxially growing to form a precursor of at least one semiconductor nano bump portion on the first surface of the conducting substrate; and
  conducting a physical and/or chemical process on the precursor of the at least one semiconductor nano bump portion so as to form the at least one semiconductor nano bump portion.

9. The manufacturing method according to claim 6, specifically comprising: arranging a nano bump portion array formed by a plurality of semiconductor nano bump portions, which are distributed at intervals, on the first surface of the conducting substrate.

10. The manufacturing method according to claim 9, comprising: filling insulating dielectrics in the intervals in the nano bump portion array, wherein preferably, the insulating dielectric comprises air, silicon oxide or silicon nitride.

11. The manufacturing method according to claim 6, further comprising: manufacturing a third electrode, wherein any of the first electrode and the second electrode is a drain, the other is a source, the third electrode is a gate, the semiconductor nano bump portion comprises a conducting channel, the source, the gate and the drain are sequentially arranged in a length direction of the semiconductor nano bump portion at intervals, the source and the drain are electrically connected through the conducting channel, the gate is arranged around the semiconductor nano bump portion, the gate and the semiconductor nano bump portion match with each other to form a Schottky heterojunction, and an effective length of the conducting channel is less than the mean free path of the carrier; and/or the first electrode and the top end of the semiconductor nano bump portion form the ohmic contact, and the second electrode and the second surface of the conducting substrate form the ohmic contact.

12. The manufacturing method according to claim 11, further comprising: manufacturing a dielectric layer between the third electrode and the semiconductor nano bump portion; and/or, further comprising: manufacturing a dielectric layer between the third electrode and the first electrode and/or the second electrode, wherein preferably, the material of the dielectric layer comprises aluminum oxide or silicon nitride.

13. The manufacturing method according to claim 6, wherein a shape of the semiconductor nano bump portion comprises any one element or a combination of more than two elements selected from a group of a cylinder, a truncated cone, a cone and a pyramid; and/or a material of the semiconductor nano bump portion comprises an n-type or p-type or intrinsic semiconductor; preferably, the material of the semiconductor nano bump portion comprises any one element or a combination of more than two elements selected from a group of Si, GaN, GaAs, ZnO, $Ga_2O_3$ and SiC.

* * * * *